United States Patent [19]

Nishimoto

[11] 4,276,515

[45] Jun. 30, 1981

[54] DIFFERENTIAL AMPLIFIER CIRCUIT ARRANGEMENT WITH STABILIZED INPUT IMPEDANCE

[75] Inventor: Yutaka Nishimoto, Hamamatsu, Japan

[73] Assignee: Nippon Gakki Seizo Kabushiki Kaisha, Hamamatsu, Japan

[21] Appl. No.: 12,701

[22] Filed: Feb. 16, 1979

[30] Foreign Application Priority Data

Mar. 1, 1978 [JP] Japan ............................. 53-25989[U]

[51] Int. Cl.$^3$ ............................................. H03F 3/45
[52] U.S. Cl. ................................... 330/253; 330/257; 330/261; 330/311
[58] Field of Search ................... 330/70, 71, 156, 252, 330/253, 257, 258, 261, 311

[56] References Cited

U.S. PATENT DOCUMENTS 3,614,645  10/1971  Wheatly, Jr. ..................... 330/261 X
4,121,169  10/1978  Iwamatsu .......................... 330/261 X

OTHER PUBLICATIONS

*Funkschau*, vol. 49, No. 16, pp. 733–738, Jul. 29, 1977.

*Primary Examiner*—James B. Mullins
*Attorney, Agent, or Firm*—Cushman, Darby & Cushman

[57] ABSTRACT

A differential amplifier circuit arrangement provided with first and second field effect transistors having their sources coupled together in common, the drain of the first field effect transistor being connected to the emitter of a bipolar transistor whose collector is connected via a drain load for this field effect transistor to a power supply line and whose base is held at a constant potential with respect to the commonly coupled sources, the drain of the second field effect transistor being coupled to the power supply line without a voltage stabilizing transistor. The bipolar transistor serves to stabilize the drain-source voltage of the first field effect transistor, thus maintaining constant the input impedance of the amplifier measured at the gate of the first field effect transistor. The differential transistors may be bipolar transistors.

6 Claims, 4 Drawing Figures

DIFFERENTIAL AMPLIFIER CIRCUIT ARRANGEMENT WITH STABILIZED INPUT IMPEDANCE

BACKGROUND OF THE INVENTION (a) Field of the Invention

The present invention relates to a differential amplifier circuit arrangement of the type that the input impedance thereof is stabilized.

(b) Description of the Prior Art

A typical example of differential amplifier circuit arrangement according to the prior art is shown in FIG. 1, which is comprised of a pair of field effect transistors $Q_1$ and $Q_2$. These field effect transistors $Q_1$ and $Q_2$, which are shown as N-channel type transistors in the Figure, have their sources connected together to a negative power supply line 2 via a constant current source 1, and their drains connected to a positive power supply line 5 via drain load resistors 3 and 4, respectively. This type of differential amplifier circuit arrangement has been widely used, for example, in the input stage circuit of an audio amplifier, wherein an input audio signal is delivered to a terminal 6 connected to the gate of the field effect transistor $Q_1$, while a certain reference voltage is supplied to a terminal 7 connected to the gate of the other field effect transistor $Q_2$. In this instance, the output of the differential amplifier is ordinarily taken out at a terminal 8 led from the drain of the field effect transistor $Q_1$.

With such known circuit arrangement of differential amplifier, the drain-source voltage of the field effect transistor $Q_1$ undergoes fluctuations in substantial amount in accordance with the input signal applied to the gate of this transistor $Q_1$, which in turn causes corresponding changes in the drain-gate leakage current $I_{DGX}$ and also in the common-source short-circuit reverse transfer capacitance $C_{rss}$ of the transistor $Q_1$. This means that the input impedance of the differential amplifier as viewed from the terminal 6 changes in response to the input signal applied thereto. If, therefore, a signal source with a relatively high impedance is connected to the terminal 6, the amplified input signal, i.e. the output signal delivered at the terminal 8, is undesirably subjected to non-linear distortion due to the variation of the input impedance of the differential amplifier.

In order to obviate the foregoing problem associated with the fluctuations of input impedance, such differential amplifier circuit arrangement as shown in FIG. 2 has been proposed, in which a cascode bootstrap circuit 11 is additionally provided for stabilizing the drain-source voltages of both field effect transistors $Q_1$ and $Q_2$. This cascode bootstrap circuit 11 comprises a pair of npn-type bipolar transistors $Q_3$ and $Q_4$ connected in cascode configuration to the drain circuits of the field effect transistors $Q_1$ and $Q_2$, respectively. That is, the emitters of the bipolar transistors $Q_3$ and $Q_4$ are connected to the drains of the field effect transistors $Q_1$ and $Q_2$, respectively, and the collectors of the bipolar transistors $Q_3$ and $Q_4$ are connected to the positive power supply line 5 via the drain load resistors 3 and 4, respectively. Also, the bases of these bipolar transistors $Q_3$ and $Q_4$ are connected to a jointing point of a series connection of resistors 9 and 10 between the positive power supply line 5 and the mutually coupled sources of the field effect transistors $Q_1$ and $Q_2$. In this circuit arrangement, the potential of the respective bases of the bipolar transistors $Q_3$ and $Q_4$ is maintained substantially constant relative to the sources of the field effect transistors $Q_1$ and $Q_2$, so that the drain-source voltages of the field effect transistors $Q_1$ and $Q_2$ are stabilized at an almost constant value independently of the input signal applied to the terminal 6. Accordingly, the aforementioned problem resulting from fluctuating input impedance can be eliminated. However, this known differential amplifier circuit has the disadvantage that it is rather complicated in configuration and costly because of the insertion, in the amplifier circuitry, of said transistor $Q_4$ which does not contribute to stabilization of the input impedance of the input terminal 6.

SUMMARY OF THE INVENTION

It is, therefore, an object of the present invention to provide an improved differential amplifier circuit arrangement which is stabilized in its input impedance, and is simplified in arrangement and accordingly is low in the cost of manufacture.

In accordance with the present invention, there is provided a differential amplifier formed with first and second transistors having their first current-carrying electrodes connected in common, the second transistor having its second current-carrying electrode coupled to a power supply line without a voltage stabilizing transistor, the first transistor having its second current-carrying electrode connected to the emitter of a bipolar transistor whose collector is connected, via a load for the first transistor, to said power supply line and whose base is held at a substantially constant potential relative to the coupled first current electrodes through a circuit means, a current-control electrode of the first transistor being connected to the input terminal of the amplifier, and the collector of the bipolar transistor being connected to an output terminal of this amplifier.

The above and other objects and features of the present invention will become apparent by reading the following detailed description of the preferred embodiments when taken in conjunction with the accompanying drawings.

DETAILED DESCRIPTION OF THE PREFERRED EMBODIMENTS

In view of the inconveniences as discussed above, the present invention intends to provide a differential amplifier circuitry which is free of those inconveniences of the prior art. The differential amplifier circuitry as proposed by the present invention may be briefly stated as comprising: a cascade connection of a bipolar transistor to an output electrode of one of two amplifying elements; a connection without a voltage stabilizing transistor of an output electrode of the other one of the two amplifying elements to a power supply terminal, to thereby supply a constant voltage to the base of said bipolar transistor with respect to the commonly connected grounded electrodes of said two amplifying elements.

Figure 3:
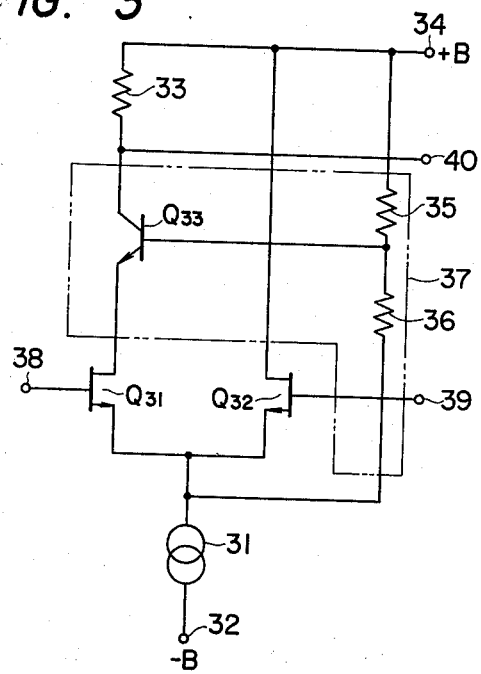
FIG. 3 shows an embodiment of a differential amplifier in accordance with the present invention.

Preferred embodiments of the present invention will hereunder be described by referring to FIG. 3.

FIG. 3 shows an embodiment of the present invention providing a differential amplifier for voltage amplification, which comprises a pair of first and second N-channel field effect transistors $Q_{31}$ and $Q_{32}$ whose first current-carrying electrodes, i.g. sources, are connected together in common via a common constant current source 31 to a negative power supply line 32. In the drain circuit of the field effect transistor $Q_{31}$, there is provided an npn-type bipolar transistor $Q_{33}$ in cascade arrangement. The emitter of the bipolar transistor $Q_{33}$ is connected to the second current-carrying electrode, i.e. drain, of the first field effect transistor $Q_{31}$ of the pair, and the collector of the bipolar transistor $Q_{33}$ is connected, via a drain load resistor 33 for the first field effect transistor $Q_{31}$, to a positive power supply line 34. A series connection of resistors 35 and 36, is connected between the positive power supply line 34 and the commonly coupled sources of the first and second field effect transistors $Q_{31}$ and $Q_{32}$. The base of the bipolar transistor $Q_{33}$ is connected to the interconnecting point of the resistors 35 and 36, so that the potential of said base of the bipolar transistor $Q_{33}$ is varied in response to the potential at the commonly coupled sources of the first and second field effect transistors $Q_{31}$ and $Q_{32}$, and thus this base of the bipolar transistor $Q_{33}$ is held at a substantially constant potential relative to the commonly coupled sources of the first and second field effect transistors thereby to keep constant the drain-source voltage of the field effect transistor $Q_{31}$. The bipolar transistor $Q_{33}$, therefore, forms a cascade bootstrap circuit 37 jointly with a series connection of the resistors 35 and 36. An input terminal 38 and an output terminal 40 of the amplifier circuit are connected to current-control electrode, i.e. the gate of the first field effect transistor $Q_{31}$, and to the collector of the bipolar transistor $Q_{33}$, respectively. On the other hand, a current-carrying electrode, i.e. the drain, of the second field effect transistor $Q_{32}$ is directly connected to the positive power supply line 34. A current-control electrode, i.e. the gate, of the second field effect transistor $Q_{32}$ is connected to a terminal 39 which is usually supplied with a certain reference potential.

The differential amplifier circuit arrangement stated above may be employed in, for example, an input stage of an audio circuit, and is operated so that an input signal is applied to the input terminal 38 after applying a certain reference voltage to the input terminal 39. The first and second field effect transistors $Q_{31}$ and $Q_{32}$ exert differential amplifying actions upon being applied with an input signal. The drain-source voltage of the first field effect transistor $Q_{31}$ is maintained substantially constant when a signal is applied to the input terminal 38, because the base of the bipolar transistor $Q_{33}$ is held at a substantially constant potential with respect to the commonly coupled sources of the first and second field effect transistors $Q_{31}$ and $Q_{32}$. Hence, the input impedance of the amplifier circuit as viewed from the input terminal 38 is prevented from fluctuating during operation, and as a result, there can be prevented such distortion of the output signal as may be caused due to non-linear variations in the input impedance of the amplifier circuit.

Figure 1:
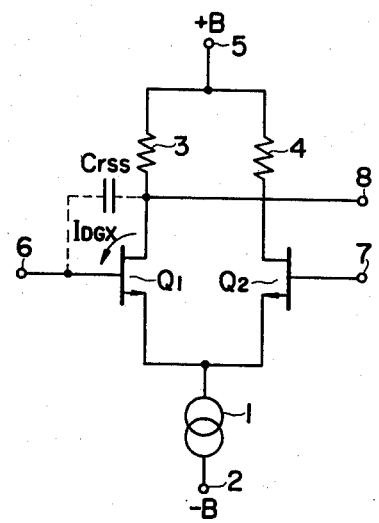
FIG. 1 shows a typical differential amplifier according to the prior art.
Figure 2:
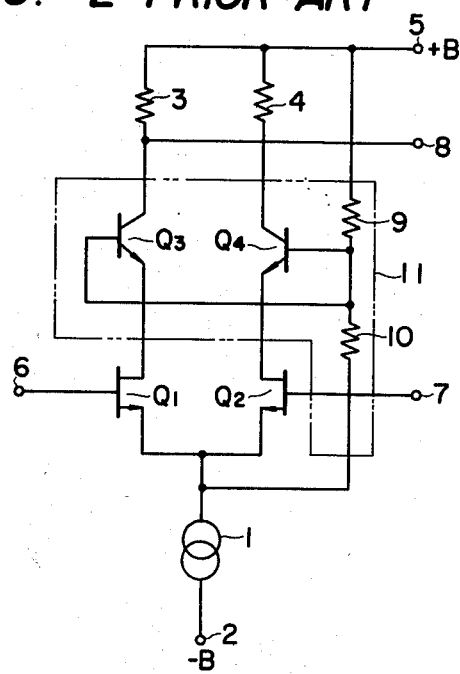
FIG. 2 shows another differential amplifier according to the prior art.

Thus, it will be understood that, in this circuit arrangement described above, there arises no drain-gate leak current $I_{DGX}$ of the first field effect transistor $Q_{31}$, nor any change in the common-source short-circuit reverse transfer capacitance $C_{rss}$ like in the known circuit arrangement shown in FIG. 1, and that the circuit of FIG. 3 is able to prevent the fluctuations of input impedance of the input terminal 38 during operation, in spite of the fact that the number of the circuit-constituting parts is fewer in the arrangement of FIG. 3 than in the circuit shown in FIG. 2.

Figure 4:
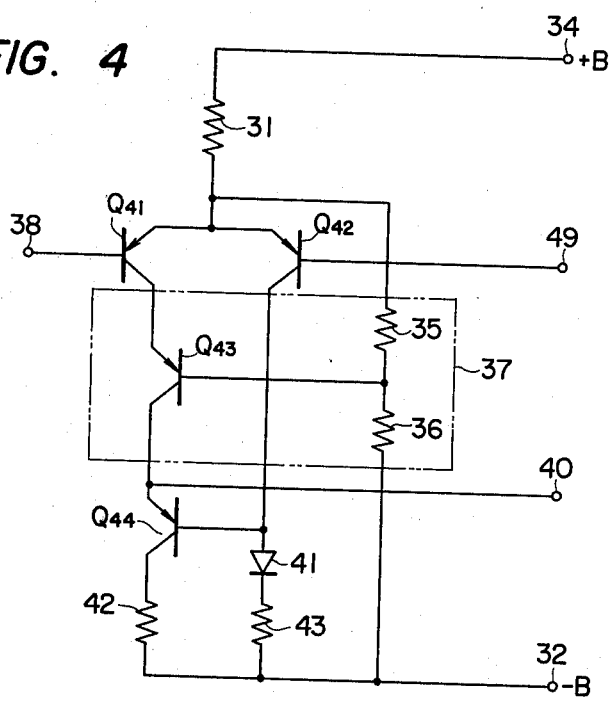
FIG. 4 shows another embodiment of a differential amplifier according to the present invention.

FIG. 4 shows another embodiment of the present invention in which are made, to the preceding embodiment, such modifications that the differentially amplifying transistors are PNP bipolar transistors $Q_{41}$ and $Q_{42}$ and that a load for the amplifying transistor $Q_{41}$ is constituted by a part of a current mirror circuit so that this amplifier serves as a current amplifier. The conductivity type of the bootstrapping transistor $Q_{43}$ is PNP to be coincident with that of the amplifying transistor $Q_{41}$. Similar circuit elements to the preceding embodiment are designated by similar reference numerals. The constant current source 31 is constituted by a resistor having a relatively large resistance value so as to be regarded as a constant current source and is connected between commonly coupled first current-carrying electrodes, i.e. emitters of the transistors $Q_{41}$ and $Q_{42}$, and the positive power supply line 34. The current mirror circuit comprises a PNP bipolar transistor $Q_{44}$ having its base connected to the anode of a diode 41, a resistor 42 inserted between the collector of this transistor $Q_{44}$ and the negative power supply line 32, and a resistor 43 inserted between the cathode of the diode 41 and the negative power supply line 32, so that the currents flowing through the transistor $Q_{44}$ and the diode 41 are forced to be equal with each other. The diode 41 may be replaced by an equivalent element, e.g. a transistor with its base and collector connected with each other. The emitter of the transistor $Q_{44}$ is connected to a second current-carrying electrode, i.e. collector of the transistor $Q_{41}$ through the bootstrapping transistor $Q_{43}$ while the anode of the diode 41 is connected to a second current-carrying electrode, i.e. collector, of the transistor $Q_{42}$. The output terminal 40 of the amplifier is led from the collector of the transistor $Q_{43}$. This embodiment attains the same advantage as does the embodiment in FIG. 3 regarding the input impedance stabilization, and further enjoys an increased amplification factor.

It should be noted that in place of the field effect transistors $Q_{31}$ and $Q_{32}$, npn-type bipolar transistors may be employed, and that in place of the bipolar transistors $Q_{41}$ and $Q_{42}$, P-channel field effect transistors may be employed.

As described above, according to the present invention, there is provided an improved differential amplifier circuit arrangement featuring: a stabilized input impedance thereof; a reduced number of circuit components; and simplified and much less expensive circuit configuration.

What is claimed is:

1. In a differential amplifier circuit for use as an input stage of an audio circuit, and having a stabilized input impedance and a signal input terminal and an output terminal, comprising:
load means;
a first amplifying transistor having a first current-carrying electrode, a second current-carrying electrode coupled to a first power supply line through said load means for said first transistor and to said output terminal of said differential amplifier circuit, and a current-control electrode connected to said signal input terminal of said differential amplifier circuit and receiving an input signal from a relatively high impedance input signal source;

a second amplifying transistor having a first current-carrying electrode connected to the first current-carrying electrode of said first transistor, a second current-carrying electrode coupled to said first power supply line, and a current-control electrode receiving a certain reference voltage; and constant current source means inserted between the commonly connected first current-carrying electrodes of said first and second transistors and a second power supply line, the improvement comprising means for preventing distortion due to said relatively high impedance input signal source and including voltage stabilizing means coupled to said differential amplifier circuit for acting only on the first transistor of said first and second transistors, said voltage stabilizing means comprising a third transistor having a first main electrode connected to the second current-carrying electrode of said first transistor, a second main electrode connected to said load means and to said output terminal, and a control electrode held at a substantially constant potential relative to the first current-carrying electrode of said first transistor by circuit means which is associated with the first current-carrying electrode of said first transistor, the coupling between said second current-carrying electrode of said second transistor and said first power supply line being a direct connection, thereby maintaining substantially constant a potential across the first and second current-carrying electrodes of said first transistor.

2. A differential amplifier circuit according to claim 1, in which: said circuit means comprises a series connection of resistors connected between said first power supply line and said commonly connected first current-carrying electrodes of said first and second transistors, and in which: said control electrode of said third transistor is connected to an interconnecting point of said resistors.

3. A differential amplifier circuit according to claim 1, in which: said first and second transistors each comprises a field effect transistor having a source corresponding to said first current-carrying electrode, a drain corresponding to said second current-carrying electrode, and a gate corresponding to said current-control electrode.

4. A differential amplifier circuit according to claim 1, in which: said first and second transistors each comprises a bipolar transistor having an emitter corresponding to said first current carrying electrode, a collector corresponding to said second current carrying electrode, and a base corresponding to said current-control electrode.

5. In a differential amplifier circuit for use as an input stage of an audio circuit, and having a stabilized input impedance and a signal input terminal and an output terminal, comprising:

load means a first amplifying transistor having a first current-carrying electrode, a second current-carrying electrode coupled to a first power supply line through said load means for said first transistor and to said output terminal of said differential amplifier circuit, and a current-control electrode connected to said signal input terminal of said differential amplifier circuit and receiving an input signal from a relatively high impedance input signal source;

a second amplifying transistor having a first current-carrying electrode connected to the first current-carrying electrode of said first transistor, a second current-carrying electrode coupled to said first power supply line, and a current-control electrode receiving a certain reference voltage; and constant current source means inserted between the commonly connected first current-carrying electrodes of said first and second transistors and a second power supply line, the improvement comprising means for preventing distortion due to said relatively high impedance input signal source wherein:

said load means for said first transistor constitutes a part of a current mirror circuit, said current mirror circuit comprising:

first and second current paths through which equal currents flow, said first current path connecting the second current-carrying electrode of said first transistor to said first power supply line, said second current path connecting the second current-carrying electrode of said second transistor to said first power supply line, said current mirror circuit also comprising:

a third transistor having a first main electrode coupled to the second current-carrying electrode of said first transistor, a second main electrode coupled to said first power supply line, and a control electrode, said current mirror circuit further comprising:

diode means inserted between the control electrode of said third transistor and said first power supply line, said differential amplifier circuit further having voltage stabilizing means coupled to said differential amplifier circuit for acting only on the first transistor of said first and second transistors, said voltage stabilizing means comprising a fourth transistor having a first main electrode connected to the second current-carrying electrode of said first transistor, a second main electrode connected to the first main electrode of said third transistor and to said output terminal, and a control electrode held at a substantially constant potential relative to the first current-carrying electrode of said first transistor by circuit means which is associated with the first current-carrying electrode of said first transistor, the second current-carrying electrode of said second transistor being directly connected to the control electrode of said third transistor, thereby maintaining substantially constant a potential across the first and second current-carrying electrodes of said first transistor.

6. A differential amplifier circuit according to claim 1 or 5, in which:

said constant current source means is constituted by a resistor having a relatively large resistance value so as to be regarded as a constant current source.

* * * * *